(12) United States Patent
Petit et al.

(10) Patent No.: US 6,384,471 B1
(45) Date of Patent: May 7, 2002

(54) PBGA PACKAGE WITH INTEGRATED BALL GRID

(75) Inventors: Claude Petit, Villebon sur Yvette; Yves Stricot, Villepreux, both of (FR)

(73) Assignee: Bull S.A., Louveciennes (FR)

(*) Notice: Subject to any disclaimer, the term of this patent is extended or adjusted under 35 U.S.C. 154(b) by 0 days.

(21) Appl. No.: 09/743,061
(22) PCT Filed: May 4, 2000
(86) PCT No.: PCT/FR00/01201
§ 371 Date: Jan. 4, 2001
§ 102(e) Date: Jan. 4, 2001
(87) PCT Pub. No.: WO00/68991
PCT Pub. Date: Nov. 16, 2000

(51) Int. Cl.[7] ............... H01L 23/02; H01L 23/48
(52) U.S. Cl. ............... 257/678; 257/693; 257/737
(58) Field of Search ............... 257/678, 693, 257/737, 738, 698; 438/106, 121

(56) References Cited

U.S. PATENT DOCUMENTS

| | | | |
|---|---|---|---|
| 5,293,072 A | * 3/1994 | Tsuji et al. | 257/737 |
| 5,420,460 A | * 5/1995 | Massingill | 257/693 |
| 5,583,378 A | * 12/1996 | Marrs et al. | 257/710 |
| 5,844,168 A | * 12/1998 | Schueller et al. | 174/52.4 |
| 5,844,315 A | * 12/1998 | Melton et al. | 257/738 |
| 6,060,778 A | * 5/2000 | Jeong et al. | 257/710 |

OTHER PUBLICATIONS

Patent Abstracts of Japan, vol. 1998, No. 09, Jul. 31, 1998 & JP 10 112472 A (Toshiba Corp.) Apr. 28, 1998 Abstract, Figs 1,3,9A–9E.

Patent Abstracts of Japan, vol. 1996, No. 08, Aug. 30, 1996, & JP 08 097314 A Dainippon Printing Co., Apr. 12, 1996; Abstract; Figs 4A–4G.

Patent Abstracts of Japan, vo. 1998, No. 14, Dec., 31 1998 & JP 10 256424 A (Toshiba), Sept. 25, 1998 –Entire Document.

Patent Abstracts of Japan, vol. 1996, No. 08, Aug. 30, 1996 & JP 08 088293 A (Mitsui High Tec Inc), Apr. 2, 1996, Abstract, Figs 4,5.

Patent Abstracts of Japan, vol. 1997, No. 01, Jan. 31, 1997 & JP 08 250835 a, Sep. 27, 1996, Abstract.

* cited by examiner

*Primary Examiner*—Jhihan B Clark
(74) *Attorney, Agent, or Firm*—Edward J. Kondracki; Miles & Stockbridge P.C.

(57) ABSTRACT

The present invention concerns a package for an integrated circuit (3) of the type comprising a cavity (2) in which the integrated circuit (3) is mounted, the active surface (10) of the integrated circuit (3) being electrically connected to the package on the level of connection (Nc) of an array of balls (13$i$) to the package, providing a mechanical and electrical link between the integrated circuit (3) and a printed circuit card to which the package must be assembled. It is characterized in that it comprises an additional layer (14) that is rigid and electrically neutral, mounted on the level of connection (Nc) of the integrated circuit (3) and the balls (13$i$) and containing the balls (13$i$).

It particularly applies to the connections of BGA and PBGA packages.

20 Claims, 2 Drawing Sheets

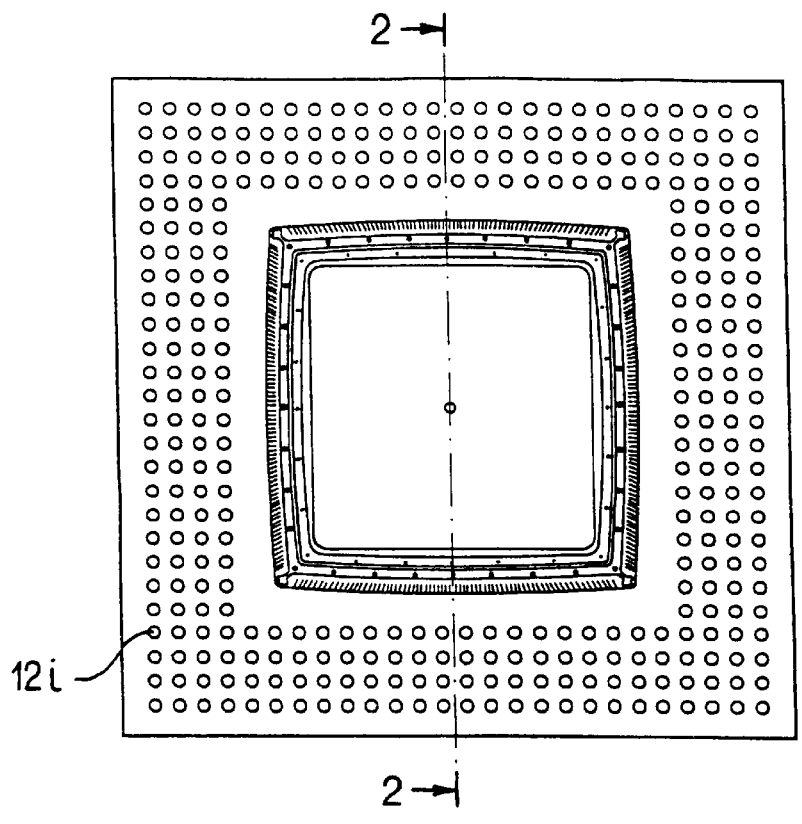
FIG_1
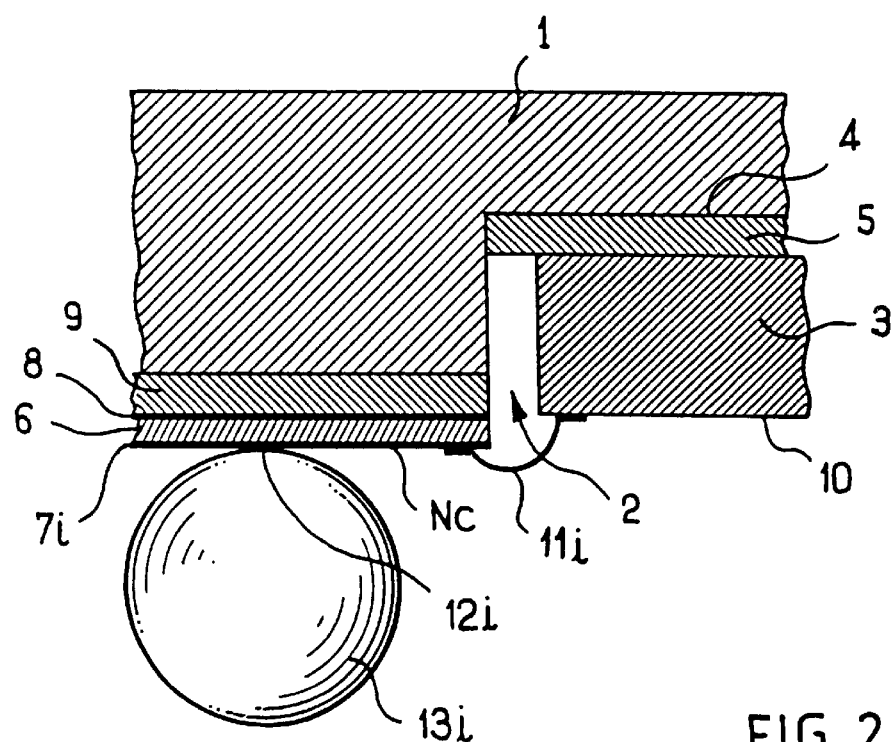
FIG_2
PRIOR ART

PBGA PACKAGE WITH INTEGRATED BALL GRID

FIELD OF THE INVENTION

The present invention relates to the field of connections in BGA, or "Ball Grid Array" packages in printed circuit cards, and more particularly concerns PGBA, or "Plastic BGA" packages.

BACKGROUND OF THE INVENTION

The standard "cavity down" type of PBGA package comprises a cavity in which an integrated circuit, also called a "chip," is housed.

In this type of package, the areas for connecting the chip to the package and the areas for connecting an array of solder balls to the package are disposed on the same level of the package, generally corresponding to the bottom surface of the package, i.e. the surface that faces the printed circuit card when the package is mounted on the card.

The ball array connects the chip to the printed circuit card both electrically and mechanically.

In order to protect the active surface of the chip constituted by a semiconductor layer, and the connections, for example bonding wires, both mechanically and from the environment, an encapsulating material is used, for example a thermosetting and electrically neutral resin, which coats the outside of the chip and its connections.

Such a method is specifically described in U.S. Pat. No. 5,397,921A.

This method, applied to the BGA package described above, has the drawback that the height of the wires thus coated by the resin must be compatible with the height of the balls, which is typically on the order of 0.6 mm for a pitch between the balls on the order of 1.27 mm.

This imposes the near exclusive use of the "gold", or "ball bonding" technique, and the package must include an "electrolytic gold" metallization, requiring the use of "feeders," which after metallization leave remaining wire ends that are equivalent to antennas for high frequencies, particularly for clock signals.

In addition to controlling the wiring loops of the wires, it is also necessary to control the height of the coating so that the wires are completely covered.

In general, a line of highly viscous adhesive is deposited around the areas for connecting the wires to the package in order to serve as a wall for retaining the coating resin, which by contrast is very fluid in nature, so that it properly coats the wires and the chip.

This wall also makes it possible to prevent an overflow of the coating resin in the areas for connecting the balls to the package.

Another drawback relates to the phenomenon of the "collapse" of the balls when the package is assembled to the printed circuit card.

In essence, during assembly, the superficial tensile forces of the alloy constituting the balls, typically remelted tin-lead, causes the balls to collapse onto the card.

Thus, a ball typically having a height of 0.6 mm for a pitch of 1.27 mm and an initial diameter before assembly of 0.76 mm will decrease in height by about 0.2 mm. This phenomenon is amplified, particularly when an integrated heat sink covers the top surface of the package; this can result in short-circuiting between the balls.

SUMMARY OF THE INVENTION

The specific object of the invention is to eliminate the aforementioned drawbacks.

To this end, the subject of the invention is a package for an integrated circuit of the type comprising a cavity in which the integrated circuit is mounted, the active surface of the integrated circuit being electrically connected to the package on the level of connection of a ball array to the package, providing a mechanical and electrical link between the integrated circuit and a printed circuit card to which the package must be assembled. The package is characterized in that it comprises an additional layer that is rigid and electrically neutral, attached to the level of connection of the integrated circuit and the balls and containing the balls.

The invention has the particular advantage of simultaneously facilitating the mounting of the balls onto the package, also called the "ball bonding" of the package, and of protecting the connections and the card.

It also makes it possible to guarantee a predefined distance of the package from the card, thus playing the role of a spacer between the package and the card.

BRIEF DESCRIPTION OF THE DRAWINGS

Other advantages and characteristics of the present invention will emerge through the reading of the following description, given in reference to the attached figures, which represent:

FIG. 1, a top view of a PBGA package equipped with an ball array;

FIG. 2, a partial cross-sectional view of the package illustrated in FIG. 1.

In these figures, the same elements are designated by the same references, and the drawings are not to scale.

Figure 3:
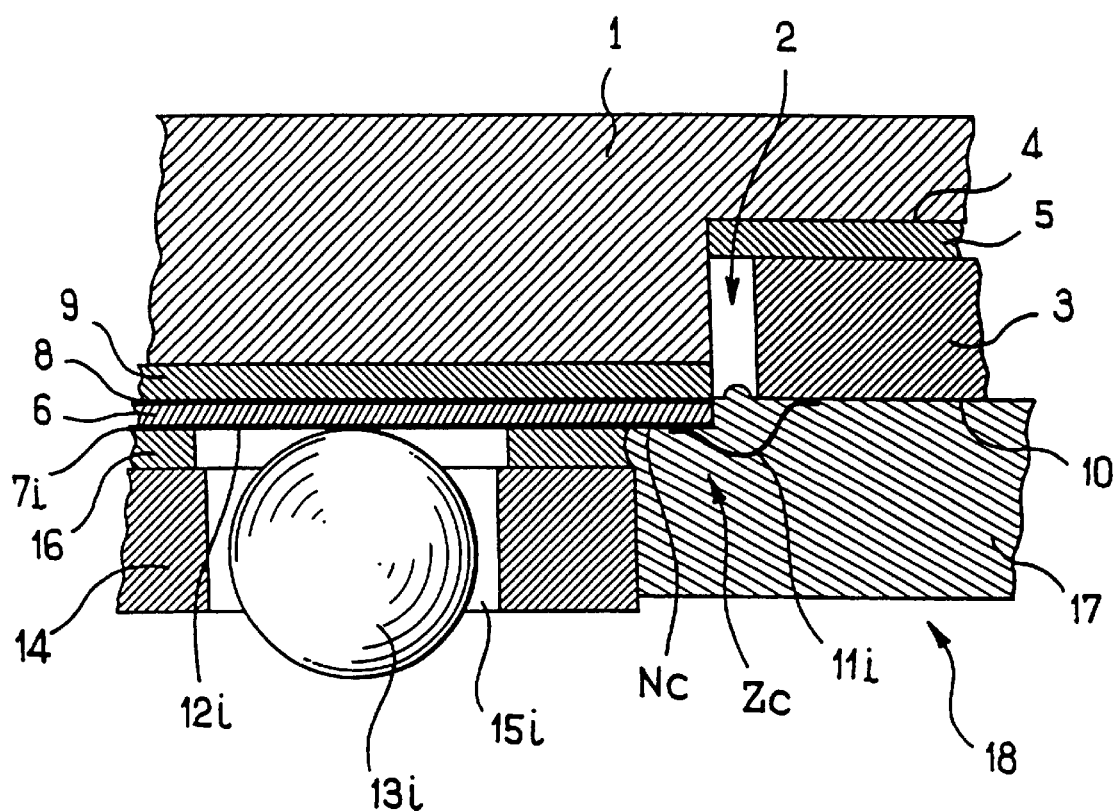
FIG. 3, a partial cross-sectional view of a package according to the invention.

Moreover, the printed circuit card to which the package is assembled is not represented.

DESCRIPTION OF THE PREFERRED EMBODIMENTS

The methods for mounting the balls on the PBGA package, mounting the chip on the card, connecting the chip to the package, and assembling the package to the card are assumed to be known and will not be described.

FIG. 1 illustrates the bottom surface of a PBGA package.

FIG. 2 illustrates the package of FIG. 1 in partial cross-section along line AA of FIG. 1.

Conventionally, a "cavity down" PBGA package is constituted by a rigid copper substrate 1, generally in the shape of a parallelepiped, comprising a cavity 2 that is generally central, enclosing a chip 3 that is attached to the bottom 4 of the cavity 2 by means of a thermally conductive adhesive 5.

The substrate 1 also supports a dielectric substrate 6 that is generally flexible, disposed on the periphery of the cavity 2, and hence of the chip 3.

The substrate 6 supports, on one of its surfaces, conductive traces 7*i* disposed according to a given design, which include the connection areas for the bonding wires and the balls.

On its other surface, it supports a conductive plane 8 that is attached to the substrate 1, for example using the same adhesive 9 that attaches the chip 3 to the bottom 4 of the cavity 2.

The active surface 10 of the chip 3 opposite the bottom 4 of the cavity 2 is electrically connected to the traces 7*i* by means of connections 11*i*, in this case connecting wires, also called "bonding" wires.

The conductive traces 7i extend from the cavity 2 and radially relative to the cavity 2, and respectively end in conductive pads 12i disposed on the periphery of the package according to a given design, as illustrated in FIG. 1.

The pads 12i are intended to receive the respective solder balls 13i, as represented in FIGS. 2 and 3.

These balls 13i, which form a ball array, provide the mechanical and electrical link between the chip 3 and the card once the package is assembled to the card.

The wiring of the wires 11i and the balls 13i to the package takes place on the same level Nc, which corresponds to the plane of the traces 7i and the conductive pads 12i.

FIG. 3 schematically illustrates, also in partial cross-section along the line AA of FIG. 1, a PBGA package according to the invention.

It has the same basic structure as the package illustrated in FIG. 2 and also comprises, at a level lower than the level of connection Nc of the wires 11i and the balls 13i to the package, an additional layer 14 containing the balls 13i that runs between the balls 13i while remaining offset relative to the cavity 2 so as not to cover the area of connection Zc of the wires 11i to the package.

The layer 14 has a given mechanical rigidity and is electrically neutral.

This layer 14 defines a grid comprising a plurality of holes 15i in which the balls 13i are respectively housed. The holes are chosen so as to be large enough to contain the balls 13i with a slight clearance on the order of 0.2 mm.

The grid 14 can be attached by an adhesive in the form of a resin or in the form of a preform, when the package is assembled to the card, or can be integrated into the structure of the package during its production.

In the embodiment described, the grid 14 is attached by means of an adhesive.

A layer of adhesive material 16 is applied so that it does not cover the connection pads 12i and so that it cannot penetrate into the holes 15i of the grid 14, for example using a serigraphic screen or a preform.

A coating material 17 fills in the space left open by the grid 14, which forms a second cavity 18 larger than the first cavity 2 containing the chip 3.

It is therefore understood that the grid 14 plays the dual role of a grid for positioning the balls 13i and an obstacle for the coating material 17 that covers the active surface 10 of the chip 3 and its bonding wires 11i. The internal periphery of the grid 14 is attached to the connection level Nc, forming a retaining wall between the balls 13i and the wires 11i.

Moreover, in accordance with a given thickness, this additional layer or grid 14 also plays the role of a spacer in the case of packages with very high ball weights, typically more than 50 mg per ball. This is especially true of packages having an integrated heat sink that covers the entire surface of the package.

This spacer role makes it possible to guarantee a pre-defined distance of the package from the card and prevents any uncontrolled collapse of the balls.

Finally, this layer makes it possible to guarantee electrical insulation between the balls when the package is assembled to the card.

It has the added advantage of making it possible to increase the solder volume by using balls of larger diameter, for example 0.96 mm instead of 0.76 mm for the same pitch between balls of 1.27 mm.

The reliability under thermal cycle of the assembled package is thereby increased.

This characteristic is particularly important in applications with high temperature constraints, including automotive applications.

The height of the soldered joints on the card, or "ring," can be higher, typically 0.7 mm instead of 0.5 mm. A soldered joint typically corresponds to a copper deposit to which the components on the periphery of the package are soldered.

This results in a relaxation of the wiring constraints, and makes it possible to use aluminum wires in accordance with the so-called "wedge" technique.

The package can then be given an "electroless gold" finish, which is less expensive than an "electrolytic gold" finish, without the presence of antennas (metallization flex).

The dimensions of a package according to the invention, as well as the materials used for each of the layers constituting the package and their respective thicknesses, are given below as a non-limiting example.

This example, given only as an illustration, does not take dimensional tolerances into account.

The package defines a parallelepiped of 35 mm per side.

The central cavity 2 defines a square of 15 mm per side, and is 40 mm deep. It is designed to receive a chip 3, generally in the shape of a parallelepiped, of 13 mm per side and 0.40 mm thick. The chip 3 is attached to the bottom 4 of the cavity 2 by means of an adhesive with a thickness of 0.10 mm, which is a high-silver epoxy resin.

The sides of the cavity 2 are respectively parallel to the sides of the package.

The package is constituted by a substrate 1 with an overall thickness of 0.7 mm and the thickness of the bottom of the substrate 1 corresponding to the bottom 4 of the cavity 2 is equal to 0.3 mm.

The substrate 1 is made of copper.

The substrate 1 receives on its bottom surface a stack of several layers, which are successively described in ascending order of the thickness of the package.

The first layer 9 is a 0.10 mm-thick layer of epoxy. It is used to attach the flexible substrate 6 to the substrate 1.

The second layer 8 corresponds to the conductive plane, which is made of copper and is 17·m thick.

The third layer 6 corresponds to the flexible substrate itself, which is made of polyimide and is 50·m thick.

The fourth layer 7i corresponds to the conductive traces, which are made of copper 17 and are·m thick.

The balls 13i and the connecting wires 11i are attached to this fourth layer 7i.

The fifth layer 16 is a layer of 0.10 mm-thick adhesive for attaching the sixth layer 14, called the "additional layer," to the fourth layer 7i of the stack, i.e. to the connecting layer Nc.

The additional layer 14 is made of 0.5 mm-thick epoxy resin. It defines a grid with a pitch of 1.27 mm comprising a plurality of holes 15i for containing the plurality of balls 13i, which in the example chosen have a diameter of 0.96 mm. The holes 15i have a generally cylindrical shape, with a circular cross section.

The diameter of the holes 15i of the grid 14 is substantially larger than the diameter of the balls 13i and is on the order of 1.05 mm.

The diameter of the balls and the maximum acceptable height after remelting define the maximum thickness of the grid 14, which plays its role as a spacer and for positioning the balls 13i on the package.

A coating material 17, for example an epoxy adhesive, covers the active surface 10 of the chip 3 as well as the connecting wires 11i. It is prevented from expanding by the fifth and sixth layers of the stack, respectively 16 and 14, and is contained in a second cavity 18 larger than the first one and defined by the inner periphery of the grid 14 bonded to the flexible substrate 6.

While this invention has been described in conjuction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the true spirit and full scope of the invention as set forth herein and defined in the claims.

What is claimed is:

1. An integrated circuit package of the "cavity down" type, comprising a first cavity (2), an integrated circuit (3) mounted in said first cavity, the integrated circuit having an active surface (10) electrically connected to the package by connecting wires (11i) on a level of connection (Nc) of an array of balls (13i), said ball array providing a mechanical and electrical link between the integrated circuit (3) and a printed circuit card to which the package must be assembled, characterized in that it further comprises a rigid and electrically neutral grid (14) having through holes 15i, said grid (14) being attached to the level of connection (Nc) of the integrated circuit (3) and the balls (13i), and the grid holes (15i) being large enough to contain the balls with a pre-established clearance.

2. A package according to claim 1, characterized in that the grid (14) defines a spacer whose thickness is a function of the diameter of the balls (13i) and a maximum acceptable height of the balls after the assembly of the package to the card.

3. A package according to claim 1, characterized in that the grid (14) defines a positioning grid for the balls (13i) that the grid contains.

4. A package according to claim 1, characterized in that the grid (14) is attached by adhesive during the assembly of the package.

5. A package according to claim 1, characterized in that the grid (14) is integrated into the structure of the package.

6. A package according to claim 2, characterized in that the grid (14) defines a positioning grid for the balls (13i) that the grid contains.

7. A package according to claim 2, characterized in that the grid (14) is attached by adhesive during the assembly of the package.

8. A package according to claim 2, characterized in that the grid (14) is attached by adhesive during the assembly of the package.

9. A package according to claim 3, characterized in that the grid (14) defines a second cavity (18) larger than the first cavity (2) in which the integrated circuit (13) is mounted, and the second cavity having an opening is delimited by a connection area (Zc) of the integrated circuit (3) to the package.

10. A package according to claim 3, characterized in that the grid (14) is attached by adhesive during the assembly of the package.

11. A package according to claim 3, characterized in that the grid (14) is integrated into the structure of the package.

12. A package according to claim 6, characterized in that the grid (14) defines a second cavity (18) larger than the first cavity (2) in which the integrated circuit (13) is mounted, and the second cavity having an opening is delimited by a connection area (Zc) of the integrated circuit (3) to the package.

13. A package according to claim 9, characterized in that the second cavity (18) contains a coating material (17) completely covering an active surface (10) of the integrated circuit (3) and connections (11i) of the integrated circuit to the package.

14. A package according to claim 9, characterized in that the grid (14) is attached by adhesive during the assembly of the package.

15. A package according to claim 9, characterized in that the grid (14) is integrated into the structure of the package.

16. A package according to claim 12, characterized in that the second cavity (18) contains a coating material (17) completely covering an active surface (10) of the integrated circuit (3) and connections (11i) of the integrated circuit to the package.

17. A package according to claim 13, characterized in that the grid (14) defines an obstacle between the connection area (Zc) of the integrated circuit (3) to the package and the ball array (13i).

18. A package according to claim 13, characterized in that grid (14) is attached by adhesive during the assembly of the package.

19. A package according to claim 13, characterized in that the grid (14) is integrated into the structure of the package.

20. A package according to claim 16, characterized in that the grid (14) defines an obstacle between the connection area (Zc) of the integrated circuit (3) to the package and the ball array (13i).

* * * * *

UNITED STATES PATENT AND TRADEMARK OFFICE
CERTIFICATE OF CORRECTION

PATENT NO.     : 6,384,471 B1
DATED          : May 7, 2002
INVENTOR(S)    : Petit et al.

It is certified that error appears in the above-identified patent and that said Letters Patent is hereby corrected as shown below:

<u>Title page,</u>
Item [30], Foreign Application Priority Data
insert -- May 10, 1999   (FR) ................... 99 05930 --;

Signed and Sealed this

Fifteenth Day of July, 2003

JAMES E. ROGAN
*Director of the United States Patent and Trademark Office*